(12) United States Patent
Buenz (10) Patent No.: US 11,630,015 B2
(45) Date of Patent: Apr. 18, 2023

(54) VERIFICATION OF CORRECT OPERATION OF A PHYSICAL PARAMETER SENSOR

(71) Applicant: Rosemount Aerospace Inc., Burnsville, MN (US)

(72) Inventor: Mark Buenz, Prior Lake, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 274 days.

(21) Appl. No.: 16/947,784

(22) Filed: Aug. 17, 2020

(65) Prior Publication Data

US 2022/0050001 A1    Feb. 17, 2022

(51) Int. Cl.
| G01L 9/02 | (2006.01) |
| G01L 9/06 | (2006.01) |
| B64F 5/60 | (2017.01) |
| G01L 13/06 | (2006.01) |
| G01R 17/10 | (2006.01) |

(52) U.S. Cl.
CPC ............... G01L 9/065 (2013.01); B64F 5/60 (2017.01); G01L 13/06 (2013.01); G01R 17/105 (2013.01)

(58) Field of Classification Search
None
See application file for complete search history.

(56) References Cited

U.S. PATENT DOCUMENTS

| 4,817,022 A * | 3/1989 | Jornod | G01D 3/022 73/765 |
| 5,457,630 A * | 10/1995 | Palmer | B64D 43/02 180/117 |
| 5,485,100 A | 1/1996 | Kogut | |
| 5,598,991 A | 2/1997 | Nadkarni et al. | |
| 5,796,612 A | 8/1998 | Palmer | |
| 6,422,088 B1 * | 7/2002 | Oba | G01R 17/10 73/754 |
| 6,646,446 B2 | 11/2003 | Maher et al. | |
| 7,928,743 B2 | 4/2011 | Ausserlechner | |

(Continued)

FOREIGN PATENT DOCUMENTS

| EP | 3196618 A2 | 7/2017 |
| EP | 3196618 A3 | 9/2017 |

OTHER PUBLICATIONS

European Search report dated Jan. 20, 2022, recieved for corresponding European Application No. 21191645.7, pp. 9.

*Primary Examiner* — Alexander A Mercado
(74) *Attorney, Agent, or Firm* — Kinney & Lange, P.A.

(57) ABSTRACT

Apparatus and associated methods relate to sensing a physical parameter and verifying correct operation of a system used to sense the physical parameter. A sensing device includes four resistive elements configured in a Wheatstone bridge configuration is configured to sense the physical parameter. A biasing network selectively provides first and second biasing conditions to the sensing device. First and second output electrical signals are generated by the sensing device in response to the first and second biasing conditions, respectively, selectively provided to the sensing device. The first and second output electrical signals are each indicative of the parameter value of the physical parameter, but not necessarily equal to one another. A verification module verifies correct operation of the system based on a consistency determination of first and second output electrical signals.

17 Claims, 4 Drawing Sheets

(56) References Cited

U.S. PATENT DOCUMENTS

| | | | |
|---|---|---|---|
| 10,353,045 B2 | 7/2019 | Timmons et al. | |
| 10,690,731 B2 | 6/2020 | Foletto et al. | |
| 11,193,844 B2 * | 12/2021 | Kollias | G01L 9/02 |
| 2007/0089526 A1 | 4/2007 | Kurtz et al. | |
| 2007/0115005 A1 * | 5/2007 | Shimizu | G01L 25/00 |
| | | | 324/549 |
| 2016/0146687 A1 * | 5/2016 | Longu | G01L 9/0047 |
| | | | 73/719 |
| 2016/0209287 A1 * | 7/2016 | Hirayama | G01L 19/04 |
| 2016/0231187 A1 * | 8/2016 | Wosnitza | G01L 9/0052 |
| 2017/0205299 A1 * | 7/2017 | Zhang | G01L 15/00 |
| 2019/0383685 A1 * | 12/2019 | Kim | G01L 27/005 |
| 2021/0010885 A1 * | 1/2021 | Matsunami | G01L 9/0073 |

* cited by examiner

VERIFICATION OF CORRECT OPERATION OF A PHYSICAL PARAMETER SENSOR

BACKGROUND

Physical-parameter sensors are used in many subsystems of an aircraft. Some physical-parameter sensors are used in the many different systems of the aircraft, and others are used to monitor operation of the aircraft, while still others are used to monitor atmospheric and flight conditions of the aircraft. Correct operation of these physical-parameter sensors ensures that accurate metrics are used for the various purposes for which these physical-parameter sensors are intended. If a physical-parameter sensor is not operating correctly, the system in which it is being used might operate in a compromised fashion.

For example, some aircraft have airfoils equipped with differential-pressure sensors configured to measure a differential pressure on opposite sides of the airfoil. Such a differential-pressure sensor can generate a signal indicative of steady-state wind or gusts normal to the airfoil. Such information can be used for various flight control operations. Should such a differential-pressure sensor be compromised, the particular system to which the differential-pressure sensor pertains can also be compromised. Therefore, verification of correct operation of these and other physical-parameter sensors could be helpful.

SUMMARY

Apparatus and associated methods relate to a system for sensing a physical parameter for verifying correct operation of the system. The system includes a sensing device, a biasing network and a verification module. The sensing device includes four resistive elements configured in a Wheatstone bridge configuration having two biasing nodes and two sensing nodes. At least one of the four resistive elements includes a sensing transducer having a resistance that varies in response to variations of a parameter value of the physical parameter. The biasing network is configured to selectively provide first and second biasing conditions to the sensing device via the first and second biasing nodes. The verification module is configured to verify correct operation of the system based on a consistency determination of first and second output electrical signals generated at the two sensing nodes of the Wheatstone bridge in response to the first and second biasing conditions, respectively, selectively provided to the sensing device. The first and second output electrical signals are indicative of the parameter value of the physical parameter.

Some embodiments relate to a method for sensing a physical parameter and for verifying correct operation of a system used for sensing the physical parameter. The method includes sensing a physical parameter via a sensing device including four resistive elements configured in a Wheatstone bridge configuration having two biasing nodes and two sensing nodes, at least one of the four resistive elements comprising a sensing transducer having a resistance that varies in response to variations of a parameter value of the physical parameter. The method includes selectively providing, via a biasing network, first and second biasing conditions to the sensing device via the first and second biasing nodes. The method includes determining consistency of first and second output electrical signals generated at the two sensing nodes of the Wheatstone bridge in response to the first and second biasing conditions, respectively, selectively provided to the sensing device, the first and second output electrical signals indicative of the parameter value of the physical parameter. The method also includes verifying, via a verification module, correct operation of the system based on the consistency determined.

DETAILED DESCRIPTION

Apparatus and associated methods relate to sensing a physical parameter and verifying correct operation of a system used to sense the physical parameter. A sensing device includes four resistive elements configured in a Wheatstone bridge configuration is configured to sense the physical parameter. A biasing network selectively provides first and second biasing conditions to the sensing device. First and second output electrical signals are generated by the sensing device in response to the first and second biasing conditions, respectively, selectively provided to the sensing device. The first and second output electrical signals are each indicative of the parameter value of the physical parameter, but not necessarily equal to one another. A verification module verifies correct operation of the system based on a consistency determination of first and second output electrical signals.

Figure 1A:
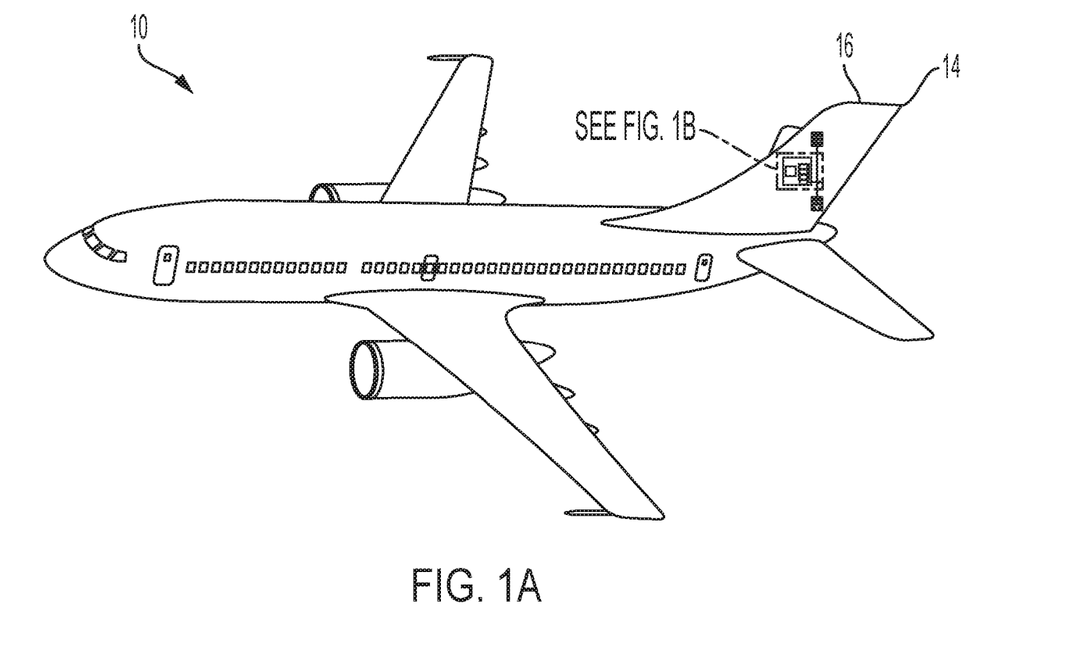
FIGS. 1A-1B are a perspective view of an aircraft that has a yaw-control system and a block diagram of the yaw control system, respectively.
Figure 1B:
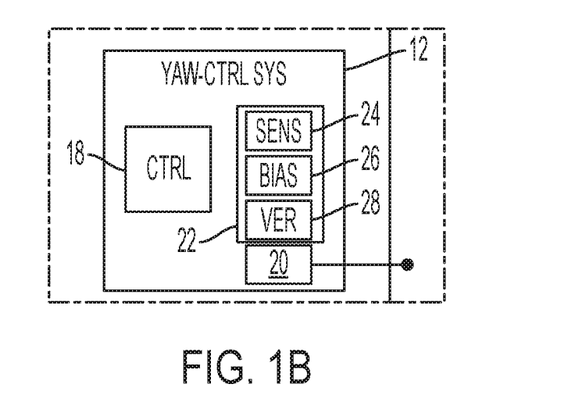

FIGS. 1A-1B are a perspective view of an aircraft that has a yaw-control system and a block diagram of the yaw control system, respectively. In FIG. 1A, aircraft 10 includes yaw-control system 12, which is depicted in greater detail in FIG. 1B. Yaw-control system 12 controls yaw of aircraft 10 by controlling orientation of rudder 14, based on a signal indicative of differential pressure on opposite sides of vertical stabilizer 16 and or rudder 14. Vertical stabilizer 16 functions to provide directional stability to the aircraft. Rudder 14 helps accomplish this task by laterally deflecting the airflow so as to change yaw (i.e., rotation in the x-y plane) of the aircraft. Yaw-control system 12 includes controller 18, yaw actuator 20, and system 22 for sensing differential pressure. Yaw-control system 12 can either control rudder 14 or augment pilot-control of rudder 14 in response to signals generated by system 22 for sensing differential pressure. For example, in one embodiment, yaw-control system 12 can be configured to provide high-frequency control of rudder 14 in response to a non-steady-state component (e.g., a high-frequency component) of a signal indicative of differential pressure generated by system 22 for sensing differential pressure.

System 22 for sensing differential pressure includes sensing device 24, biasing network 26 and verification module 28. In the embodiment depicted in FIG. 1, sensing device 24 is a differential-pressure sensor coupled to vertical stabilizer 16 in such a manner that permits sensing of differential pressure on opposite sides of vertical stabilizer 16 (and/or, e.g., rudder 14). Biasing network 26 is configured to selectively provide two different biasing conditions—first and second biasing conditions—to sensing device 24. Verification module 28 can verify correct operation by comparing first output electrical signal to second output electrical signal. The underlying idea is to use first and second biasing conditions that will cause first and second output electrical signals that are both different from one another, and indicative of correct operation by a simple relational test to one another. In some embodiments, verification module 28 can control biasing network 26. In other embodiments, a separate controller can coordinate operations of biasing network 26 and verification module 28, such that verification of correct operation of sensing device 24 can be determined.

Figure 2:
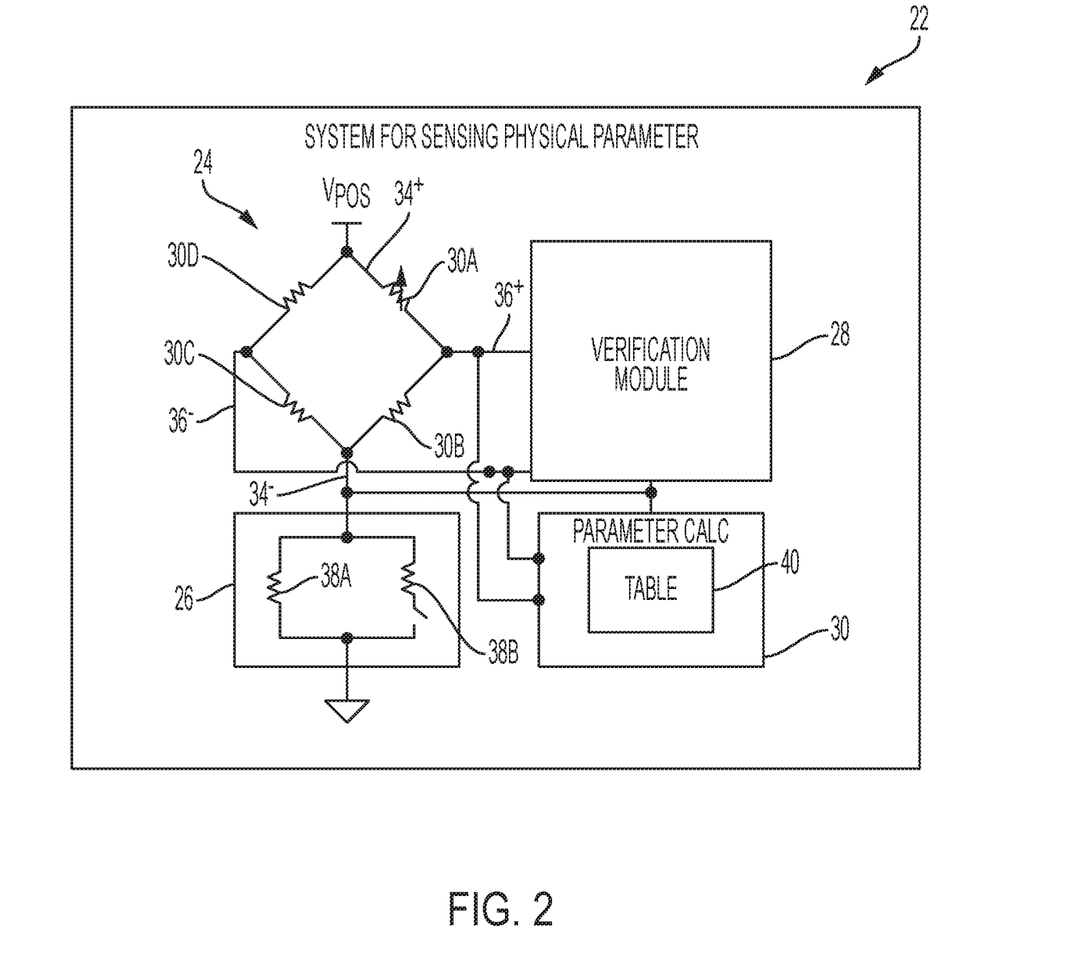
FIG. 2 is a block diagram of a system for sensing a physical parameter that provides verification of correct operation.

FIG. 2 is a block diagram of a system for sensing a physical parameter that provides verification of correct operation. In FIG. 2, system 22 for sensing a physical parameter includes sensing device 24, biasing network 26 verification module 28 and parameter calculator 30. Sensing device 24 is configured to generate an output electrical signal indicative of a sensed parameter, for example differential pressures as described above with reference to FIG. 1. The sensed differential pressure can indicate a steady-state pressure difference and/or a non-steady-state pressure difference across vertical stabilizer 16. Sensing device 24 includes four resistive elements 32A-32D configured in a Wheatstone bridge configuration having two biasing nodes 34+ and 34− and two sensing nodes 36+ and 36−. At least one of the four resistive elements 32A-32D include a sensing transducer—32A in the depicted embodiment—having a resistance that varies in response to variations of a parameter value (i.e., differential pressure across vertical stabilizer 16 in the FIG. 1 embodiment) of the physical parameter. In some embodiments two, three, or all four of the four resistive elements 32A-32D can include a sensing transducer.

Sensing device 26 is selectively provided biasing signals corresponding to the first biasing condition or the second biasing condition from biasing network 26. Sensing device 24 has two sensing nodes 36+ and 36−, upon which are generated the output electrical signal of sensing device 24. Sensing device 24 is configured as a Wheatstone bridge, having four interconnected resistive legs 32A-32D. Sensing device 24 has two biasing nodes 34+ and 34−, which receive biasing signals corresponding to the first and second biasing conditions. At least one of the interconnected resistive legs 32A-32D has a resistance that is temperature dependent. Thus, resistance of sensing device 24, as measured between biasing nodes 34+ and 34− varies in response to variations of temperature. Such temperature dependent resistance between biasing nodes 34+ and 34− can be used to generate a signal indicative of temperature. For example, voltage of biasing node 34− can be indicative of temperature, when biasing node 34+ and 34− are connected to and provided a biasing signal from biasing network 26.

Biasing network 26 is configured to selectively provide two different biasing conditions—first and second biasing conditions—to sensing device 24. First and second biasing conditions are provided to sensing device 24 via the first and second biasing nodes 34+ and 34−. First and second output electrical signals are generated at sensing nodes 36+ and 36−. First and second output electrical signals are generated in response to first and second biasing conditions, respectively. First and second biasing conditions are configured to bias sensing device 24 such that first and second output electrical signals are related to one another in a manner that can be used to determine whether sensing device 24 is operating correctly. For example, in some embodiments, first and second biasing conditions are configured to result in first and second output electrical signals being with a predetermined offset range from one another. First output electrical signal might be 2.0 Volts higher than second output electrical signal+/−0.3 Volts, for example. If first output electrical signal is within such an offset range—between 1.7 and 2.3 Volts—above second output electrical signal, then sensing device 24 is operating correctly. If, however, first and second output electrical signals are not related in such a fashion, then correct operation is not verified.

In some embodiments, first and second biasing conditions are first and second currents conditions. In other embodiments, first and second biasing conditions are first and second voltage conditions. In still other embodiments, first and second biasing conditions are first and second Thevenin series resistance conditions or first and second Norton parallel resistance conditions. For example, in a specific embodiment depicted in FIG. 2, a voltage supply (e.g., 24 Volts DC) can be connected to first biasing node 34+, and second biasing node 34− can be connected to a ground reference via first and second biasing resistors 38A and 38B, thereby forming first and second Thevenin series resistance conditions.

Verification module 28 can verify correct operation by comparing first output electrical signal to second output electrical signal. The underlying idea is to use first and second biasing conditions that will cause first and second output electrical signals that are both different from one another, and indicative of correct operation by a simple relational test to one another. In some embodiments, verification module 28 can control biasing network 26. In other embodiments, a separate controller can coordinate operations of biasing network 26 and verification module 28, such that verification of correct operation of sensing device 24 can be determined.

In the depicted embodiment, verification module 28 is in electrical communication with sensing module 24 and/or biasing network 26 so as to receive output electrical signals and/or temperature signal therefrom. For example, verification module 28 can be electrically connected to sensing nodes 36+ and 36− so as to receive output electrical signals provided thereby. Verification module 28 can be connected to biasing node 34− and/or biasing node 34+, so as to receive a signal indicative of temperature provided thereby. To verify correct operation, verification module 28 can compare either output electrical signals indicative of sensed parameter values and/or temperature signals generated using two or more biasing conditions. In some embodiments, first and second output electrical signals corresponding to first and second biasing conditions, respectively, can be compared so as to verify correct operation of sensing device 24. In some embodiments, first and second temperature signals corresponding to first and second biasing conditions, respectively, can be compared so as to verify correct operation of sensing device 24.

Parameter calculator 30 is configured to receive output electrical signals from sensing nodes 36+ and 36−, as well as temperature signals from biasing node 34−. Parameter calculator is configured to calculate a parameter value of the physical parameter based on the output electrical signals and the temperature signals. In some embodiments, parameter calculator will calculate the parameter value of the physical parameter by adding an offset factor to a product of the output electrical signal and a linear factor. In the depicted embodiment, the linear factor and the offset factor are retrieved from table 40, which is indexed by temperature.

Thus, temperature is first calculated based on the temperature signal. Then parameter calculator 30 retrieves the linear factor and the offset factor corresponding to the temperature calculated (or the temperature signal). Then, parameter calculator calculates the parameter value using the linear and offset factors retrieved. In other embodiments, other mathematical operations can be used to calculate the parameter value.

Figure 3:
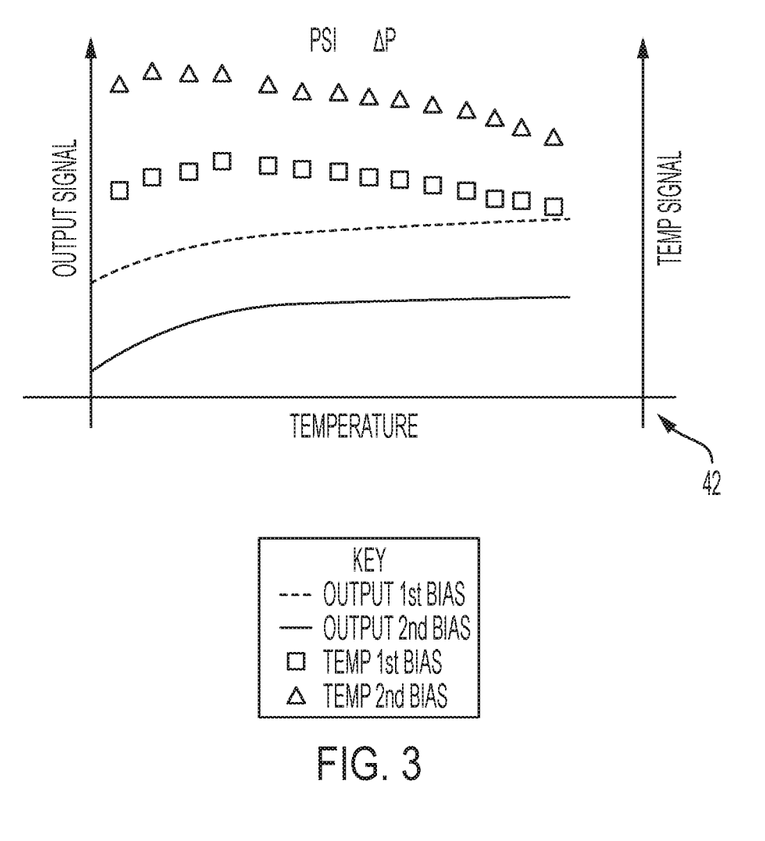
FIG. 3 is a graph demonstrating data collected during calibration of a system for sensing a physical parameter that provides verification of correct operation.

FIG. 3 is a graph demonstrating data collected during calibration of a system for sensing a physical parameter that provides verification of correct operation. In FIG. 3, graph 42 depicts the data collection of the output electrical signal in response to varying temperature at a particular physical parameter (e.g., a pressure differential) that is incident on the sensing device. Graph 42 also depicts a measurement of the temperature signal of the sensing device. These data are plotted on the graph for both the first and second biasing conditions described above.

Such a graph can be used to collect data for determining the operating range of the sensing device. The output electrical signal, in this case a voltage differential, and temperature signal are determined as a function of temperature for each biasing condition. The values of these measurements in the graph can be used in a lookup table with or without correction, such as, for example, linear correction using linear gain factor and offset value coefficients. The same can be done for the second biasing condition to produce a corrected output. The result of the second biasing condition output should be within an expected offset range of the first biasing condition output if the sensing device is functioning correctly. If the second biasing condition output is not within the expected offset range of the first biasing condition output, then the sensing device is can be deemed as not functioning correctly. The verification of correct operation can be done via the verification module. Graph 42, with all the temperature data available, can provide the operating range of the sensing device.

Figure 4:
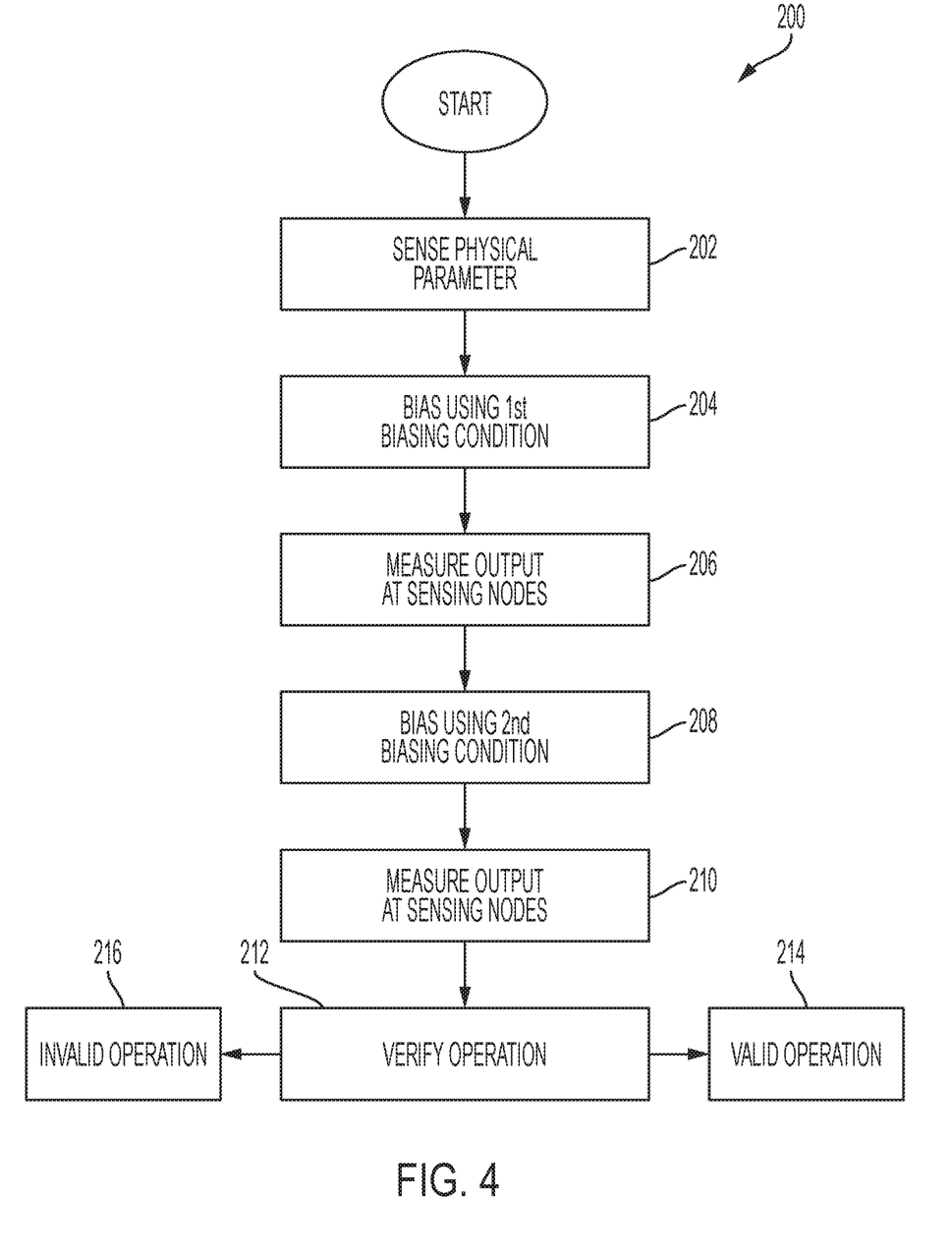
FIG. 4 is a flow chart detailing the steps of an exemplary method of verifying correct operation of a physical parameter sensor.

FIG. 4 is a flow chart detailing the steps of an exemplary method of verifying correct operation of a physical parameter sensor. Method 200 begins at step 202 where the physical parameter is sensed by the sensing device. Then, at step 204, the first biasing condition is applied via the biasing network to the sensing device. Next, at step 206, the output electrical signal measurements at the output sensing nodes of the sensing device are made while the first biasing condition is applied. A measurement is also made at the temperature sensing node. Then, at step 208, the second biasing condition is applied to the sensing device via the biasing network. Next, at step 210, output electrical signal measurements are again obtained at the output sensing nodes of the sensing device and at the temperature measurement node. Next, at step 212, the measurement information obtained from both of the biasing conditions is sent to the verification module. The verification module makes a final determination about sensor operation based on a consistency determination between first and second output measurements. It either outputs valid condition 214 or invalid condition 216.

Discussion of Possible Embodiments

The following are non-exclusive descriptions of possible embodiments of the present invention.

Apparatus and associated methods relate to a system for sensing a physical parameter for verifying correct operation of the system. The system includes a sensing device, a biasing network and a verification module. The sensing device includes four resistive elements configured in a Wheatstone bridge configuration having two biasing nodes and two sensing nodes. At least one of the four resistive elements includes a sensing transducer having a resistance that varies in response to variations of a parameter value of the physical parameter. The biasing network is configured to selectively provide first and second biasing conditions to the sensing device via the first and second biasing nodes. The verification module is configured to verify correct operation of the system based on a consistency determination of first and second output electrical signals generated at the two sensing nodes of the Wheatstone bridge in response to the first and second biasing conditions, respectively, selectively provided to the sensing device. The first and second output electrical signals are indicative of the parameter value of the physical parameter.

The system of the preceding paragraph can optionally include, additionally and/or alternatively, any one or more of the following features, configurations and/or additional components:

A further embodiment of the foregoing system, wherein the verification module can determine that the first and second output electrical signals are consistent with one another when a difference between the first and second output electrical signals is within a consistency range.

A further embodiment of any of the foregoing systems, wherein the consistency range can include a range of +/−a predetermined delta of a predetermined offset.

A further embodiment of any of the foregoing systems, wherein the verification can be further configured to determine incorrect operation based on an inconsistency determination of first and second output electrical signals generated at the two sensing nodes of the Wheatstone in response to the first and second biasing conditions, respectively, selectively provided to the sensing device.

A further embodiment of any of the foregoing systems, wherein the verification module can determine that the first and second output electrical signals are inconsistent with one another when a difference between the first and second output electrical signals is not within a consistency range.

A further embodiment of any of the foregoing systems can further include a parameter calculator configured to calculate the parameter value of the physical parameter by adding a first offset factor to a product of the first output electrical signal and a first linear factor.

A further embodiment of any of the foregoing systems, wherein the first linear factor and the first offset factor can be retrieved from a table indexed by temperature.

A further embodiment of any of the foregoing systems, wherein the parameter calculator can be further configured to calculate the parameter value of the physical parameter by adding a second offset factor to a product of the second output electrical signal and a second linear factor.

A further embodiment of any of the foregoing systems, wherein a device resistance of the sensing device, as measured between the two sensing nodes, can vary in response to variations in temperature.

A further embodiment of any of the foregoing systems, wherein the verification module can be further configured to generate first and second temperature signals indicative of temperature based on a voltage difference between either the two sensing nodes or across the biasing network in response to providing the sensing device with the first and second biasing conditions, respectively.

A further embodiment of any of the foregoing systems, wherein the physical parameter sensor can be configured to measure a differential pressure on opposite sides of an airfoil of an airplane.

A further embodiment of any of the foregoing systems, wherein the sensing transducer can be a piezoresistive strain gauge.

Some embodiments relate to a method for sensing a physical parameter and for verifying correct operation of a system used for sensing the physical parameter. The method includes sensing a physical parameter via a sensing device including four resistive elements configured in a Wheatstone bridge configuration having two biasing nodes and two sensing nodes, at least one of the four resistive elements comprising a sensing transducer having a resistance that varies in response to variations of a parameter value of the physical parameter. The method includes selectively providing, via a biasing network, first and second biasing conditions to the sensing device via the first and second biasing nodes. The method includes determining consistency of first and second output electrical signals generated at the two sensing nodes of the Wheatstone bridge in response to the first and second biasing conditions, respectively, selectively provided to the sensing device, the first and second output electrical signals indicative of the parameter value of the physical parameter. The method also includes verifying, via a verification module, correct operation of the system based on the consistency determined.

The method of the preceding paragraph can optionally include, additionally and/or alternatively, any one or more of the following features, configurations and/or additional components:

A further embodiment of the foregoing method, wherein determining consistency can include comparing, via the verification module, a difference between the first and second output electrical signals with a consistency range.

A further embodiment of any of the foregoing methods, wherein the consistency range can include and range of +/−a predetermined delta of a predetermined offset.

A further embodiment of any of the foregoing methods can further include calculating, via a parameter calculator, the parameter value of the physical parameter by adding a first offset factor to a product of the first output electrical signal and a first linear factor.

A further embodiment of any of the foregoing methods can further include retrieving the first linear factor and the first offset factor from a table indexed by temperature.

A further embodiment of any of the foregoing methods can further include retrieving the second linear factor and the second offset factor from a table indexed by temperature.

A further embodiment of any of the foregoing methods, wherein the physical parameter sensor can be configured to measure a differential pressure on opposite sides of an airfoil of an airplane.

A further embodiment of any of the foregoing methods, wherein a device resistance of the sensing device, as measured between the two sensing nodes, can vary in response to variations in temperature. The method can further include generating, via the verification module, first and second temperature signals indicative of temperature based on a voltage difference between either the two sensing nodes or across the biasing network in response to providing the sensing device with the first and second biasing conditions, respectively.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for sensing a physical parameter for verifying correct operation of the system, the system comprising:
   a sensing device including four resistive elements configured in a Wheatstone bridge configuration having two biasing nodes and two sensing nodes, at least one of the four resistive elements comprising a sensing transducer having a resistance that varies in response to variations of a parameter value of the physical parameter;
   a biasing network configured to selectively provide first and second biasing conditions to the sensing device via the first and second biasing nodes, the first and second biasing conditions configured to cause first and second output electrical signals generated at the two sensing nodes of the Wheatstone bridge in response to the first and second biasing conditions, respectively, selectively provided to the sensing device to be different from one another; and
   a verification module configured to verify correct operation of the system based on a consistency determination of the first and second output electrical signals, the first and second output electrical signals indicative of the parameter value of the physical parameter, wherein consistency between the first and second output electrical signals is determined if the first output electrical signal is within a consistency range defined by a predetermined delta of a non-zero predetermined offset from the second output electrical signal.

2. The system of claim 1, wherein the consistency range is between 1.7 and 2.0 volts.

3. The system of claim 1, wherein the verification is further configured to determine incorrect operation based on an inconsistency determination of first and second output electrical signals generated at the two sensing nodes of the Wheatstone in response to the first and second biasing conditions, respectively, selectively provided to the sensing device, wherein the verification module determines that the first and second output electrical signals are inconsistent with one another when a difference between the first and second output electrical signals is not within the consistency range.

4. The system of claim 1, further comprising:
   a parameter calculator configured to calculate the parameter value of the physical parameter by adding a first offset factor to a product of the first output electrical signal and a first linear factor.

5. The system of claim 4, wherein the first linear factor and the first offset factor are retrieved from a table indexed by temperature.

6. The system of claim 4, wherein the parameter calculator is further configured to calculate the parameter value of the physical parameter by adding a second offset factor to a product of the second output electrical signal and a second linear factor.

7. The system of claim 1, wherein a device resistance of the sensing device, as measured between the two sensing nodes, varies in response to variations in temperature.

8. The system of claim 7, wherein the verification module is further configured to generate first and second temperature signals indicative of temperature based on a voltage difference between either the two sensing nodes or across the biasing network in response to providing the sensing device with the first and second biasing conditions, respectively.

9. The system of claim 1, wherein the physical parameter sensor is configured to measure a differential pressure on opposite sides of an airfoil of an airplane.

10. The system of claim 1, wherein the sensing transducer is a piezoresistive strain gauge.

11. A method for sensing a physical parameter and for verifying correct operation of a system used for sensing the physical parameter, the method comprising:
  sensing a physical parameter via a sensing device including four resistive elements configured in a Wheatstone bridge configuration having two biasing nodes and two sensing nodes, at least one of the four resistive elements comprising a sensing transducer having a resistance that varies in response to variations of a parameter value of the physical parameter;
  selectively providing, via a biasing network, first and second biasing conditions to the sensing device via the first and second biasing nodes, the first and second biasing conditions configured to cause first and second output electrical signals generated at the two sensing nodes of the Wheatstone bridge in response to the first and second biasing conditions, respectively, selectively provided to the sensing device to be different from one another;
  determining consistency of the first and second output electrical signals, the first and second output electrical signals indicative of the parameter value of the physical parameter, wherein consistency between the first and second output electrical signals is determined if the first output electrical signal is within a consistency range defined by a predetermined delta of a non-zero predetermined offset from the second output electrical signal; and
  verifying, via a verification module, correct operation of the system based on the consistency determined.

12. The method of claim 11, wherein the consistency range is between 1.7 and 2.0 volts.

13. The method of claim 11, further comprising
  calculating, via a parameter calculator, the parameter value of the physical parameter by adding a first offset factor to a product of the first output electrical signal and a first linear factor.

14. The method of claim 13, further comprising:
  retrieving the first linear factor and the first offset factor from a table indexed by temperature.

15. The method of claim 14, further comprising:
  calculating, via the parameter calculator, the parameter value of the physical parameter by adding a second offset factor to a product of the second output electrical signal and a second linear factor;
  retrieving the second linear factor and the second offset factor from a table indexed by temperature.

16. The method of claim 11, wherein the physical parameter sensor is configured to measure a differential pressure on opposite sides of an airfoil of an airplane.

17. The method of claim 11, wherein a device resistance of the sensing device, as measured between the two sensing nodes, varies in response to variations in temperature, the method further comprising:
  generating, via the verification module, first and second temperature signals indicative of temperature based on a voltage difference between either the two sensing nodes or across the biasing network in response to providing the sensing device with the first and second biasing conditions, respectively.

* * * * *